(12) United States Patent
Yamashina et al.

(10) Patent No.: US 9,093,996 B2
(45) Date of Patent: Jul. 28, 2015

(54) DIRECT DIGITAL SYNTHESIZER, REFERENCE FREQUENCY GENERATING DEVICE, AND SINE WAVE OUTPUTTING METHOD

(71) Applicant: FURUNO ELECTRIC CO., LTD., Nishinomiya, Hyogo (JP)

(72) Inventors: Katsuhisa Yamashina, Nishinomiya (JP); Kazunori Miyahara, Nishinomiya (JP)

(73) Assignee: FURUNO ELECTRIC COMPANY LIMITED, Hyogo (JP)

( * ) Notice: Subject to any disclaimer, the term of this patent is extended or adjusted under 35 U.S.C. 154(b) by 0 days.

(21) Appl. No.: 14/366,423

(22) PCT Filed: Dec. 10, 2012

(86) PCT No.: PCT/JP2012/081948
§ 371 (c)(1),
(2) Date: Jun. 18, 2014

(87) PCT Pub. No.: WO2013/094459
PCT Pub. Date: Jun. 27, 2013

(65) Prior Publication Data
US 2014/0361812 A1     Dec. 11, 2014

(30) Foreign Application Priority Data
Dec. 19, 2011   (JP) .................................. 2011-277498

(51) Int. Cl.
*H03K 4/08* (2006.01)
*H03K 4/02* (2006.01)
*G06F 1/02* (2006.01)
*H03L 7/099* (2006.01)
(Continued)

(52) U.S. Cl.
CPC ............ *H03K 4/08* (2013.01); *G06F 1/022* (2013.01); *H03B 28/00* (2013.01); *H03K 4/026* (2013.01); *H03L 7/099* (2013.01); *H03L 7/183* (2013.01); *H03L 7/23* (2013.01); *H03L 7/235* (2013.01)

(58) Field of Classification Search
USPC ................. 327/105–107, 147, 150, 156, 159; 331/34, 40; 375/271, 272, 302, 303, 375/308
See application file for complete search history.

(56) References Cited

U.S. PATENT DOCUMENTS

| | | | |
|---|---|---|---|
| 4,802,009 A | 1/1989 | Hartmeier | |
| 5,473,274 A * | 12/1995 | Reilly et al. | .................. 327/159 |

(Continued)

FOREIGN PATENT DOCUMENTS

| | | |
|---|---|---|
| JP | S50-140243 A | 11/1975 |
| JP | S60-52754 U | 4/1985 |

(Continued)

*Primary Examiner* — An Luu
(74) *Attorney, Agent, or Firm* — Global IP Counselors, LLP (57) ABSTRACT

A DDS achieved in size and cost reductions by removing a ROM for storing a table and the like and suppressing an operation amount is provided. A DDS includes an NCO, a DAC, and a BPF. The NCO outputs a sawtooth wave. The DAC converts either one of the sawtooth wave outputted from the NCO and a triangle wave signal converted by a waveform converting circuit based on the sawtooth wave, from a digital signal into an analog signal. The BPF receives the signal converted into the analog signal by the DAC and extracts a sine wave at a predetermined frequency from the inputted signal, by allowing a signal at a frequency within a fixed range to pass therethrough.

16 Claims, 8 Drawing Sheets

(51) Int. Cl.
*H03L 7/183* (2006.01)
*H03L 7/23* (2006.01)
*H03B 28/00* (2006.01)

(56) References Cited

U.S. PATENT DOCUMENTS

| | | | |
|---|---|---|---|
| 5,539,346 A | 7/1996 | Goto | |
| 5,834,985 A * | 11/1998 | Sundegård | 332/100 |
| 7,269,228 B2 * | 9/2007 | Shiung | 375/272 |
| 7,391,839 B2 * | 6/2008 | Thompson | 375/376 |
| 8,224,234 B1 * | 7/2012 | Schuster et al. | 455/1 |

FOREIGN PATENT DOCUMENTS

| | | |
|---|---|---|
| JP | S63-59414 U | 4/1988 |
| JP | S64-036184 A | 2/1989 |
| JP | H04-178005 A | 6/1992 |
| JP | H05-206732 A | 8/1993 |
| JP | H07-202692 A | 8/1995 |
| JP | 2005-045674 | 2/2005 |

* cited by examiner

FIG. 3(a) — SAWTOOTH WAVE / SINE WAVE AT SAME FREQUENCY AS SAWTOOTH WAVE

FIG. 3(b) — SAWTOOTH WAVE / SINE WAVE AT TWICE THE FREQUENCY OF SAWTOOTH WAVE

FIG. 3(c) — SAWTOOTH WAVE / SINE WAVE AT FOUR TIMES THE FREQUENCY OF SAWTOOTH WAVE

FIG. 8(a) CONVENTIONAL EXAMPLE

FIG. 8(b) EMBODIMENT

FIG. 8(c) MODIFICATION

DIRECT DIGITAL SYNTHESIZER, REFERENCE FREQUENCY GENERATING DEVICE, AND SINE WAVE OUTPUTTING METHOD

CROSS REFERENCE TO RELATED APPLICATIONS

This application is a U.S. National stage of International Application No. PCT/JP2012/081948 filed on Dec. 10, 2012. This application claims priority to Japanese Patent Application No. 2011-277498 filed on Dec. 19, 2011. The entire disclosure of Japanese Patent Application No. 2011-277498 is hereby incorporated herein by reference.

BACKGROUND

1. Field of the Invention

The present invention mainly relates to a direct digital synthesizer, which can output a sine wave at a predetermined frequency.

2. Background Information

Figure 8A:
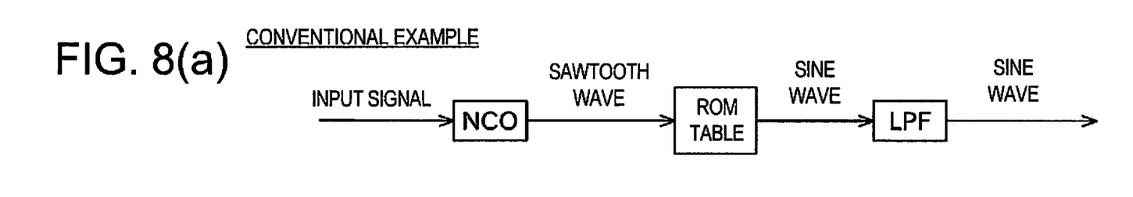
FIGS. 8(a), 8(b) and 8(c) show views for comparing a configuration of a conventional DDS and configurations of a DDS of the present invention.

Conventionally, as described in FIG. 8(a), DDSs (Direct Digital Synthesizers) each including an NCO (Numerically Controlled Oscillator), a ROM, and an LPF (Low-pass Filter), have been known.

The NCO outputs a sawtooth wave at a predetermined frequency. The ROM stores, as a table, output values (a phase of the sawtooth wave) from the NCO and an amplitude (displacement) of a sine wave which is set corresponding to the output values. By performing a conversion based on this table, the sawtooth wave can be converted into the sine wave. Then, this sine wave is outputted after a high frequency element thereof is removed by an LPF.

JP2005-045674A (Patent Document 1) includes an integration circuit having a similar configuration to the NCO, a multiplication circuit, and an error correcting unit. The multiplication circuit performs predetermined operation on a sawtooth wave, which is to be outputted from the multiplication circuit, to convert this sawtooth wave into a parabolic signal. The error correcting unit corrects the parabolic signal obtained from the multiplication circuit, based on an ideal sine waveform stored in a storage in advance. Thus, a sine wave can be formed.

SUMMARY

However, in a case where the DDS having the configuration illustrated in FIG. 8(a) uses an NCO with high resolution, the DDS needs to store multiple relations between the phase of the sawtooth wave and the displacement of the sine wave in order to sufficiently exert the performance of the NCO. In this case, a ROM with a large storing capacity is required, and therefore, the size of the ROM increases, which prevents downsizing of the device.

Moreover, the DDS disclosed in Patent Document 1 does not need to store the table described above; however, in order to output sine waves at a plurality of frequencies, it needs to store a plurality of ideal sine waveforms (or obtain them by operation). Therefore, it can be considered that this DDS will need a large ROM or the operation amount will increase. Moreover, in a case where an NCO with high resolution is used, the operation amount when converting the sawtooth wave into the parabolic signal increases, and therefore, using such an NCO may be CPU intensive.

The present invention is made in view of the above situations and it aims to provide a DDS achieved in size and cost reductions by removing a ROM for storing a table and the like and suppressing an operation amount.

Problems to be solved by the present invention are described above, and means for solving the problems and effects thereof will be described below.

According to a first aspect of the present invention, a direct digital synthesizer having the following configuration is provided. That is, the direct digital synthesizer includes a numerically controlled oscillator, a DAC, and a band-pass filter. The numerically controlled oscillator outputs a sawtooth wave. The DAC converts either one of the sawtooth wave outputted from the numerically controlled oscillator and a signal obtained based on the sawtooth wave, from a digital signal into an analog signal. The band-pass filter receives the signal converted into the analog signal by the DAC and extracts a sine wave at a predetermined frequency from the inputted signal, by allowing a signal at a frequency within a fixed range to pass therethrough.

Thus, the sine wave can be outputted without providing a ROM for storing the table, which has been used in the conventional DDS, and while suppressing an operation amount. Therefore, the DDS can be reduced in size, as well as the manufacturing cost. Moreover, by using different band-pass filters with different frequency bands (passing bands) to pass therethrough, not only the sine wave at the same frequency as the sawtooth wave, but also sine waves at various frequencies can be outputted.

The direct digital synthesizer described above preferably includes a waveform converting unit configured to convert the sawtooth wave outputted from the numerically controlled oscillator into a triangle wave.

Thus, since the triangle wave and the sine wave have similar waveforms, when the sine wave at the same frequency as the triangle wave is outputted, the sine wave can be outputted by effectively utilizing a triangle wave to serve as the base (without greatly dropping the signal intensity).

With the direct digital synthesizer described above, the waveform converting unit preferably includes a circuit configured to perform operation of an exclusive disjunction on a half cycle of the sawtooth wave to invert the sawtooth wave of the half cycle.

Thus, the sawtooth wave can be converted into the triangle wave with the simple configuration.

The direct digital synthesizer described above is preferably configured as follows. That is, the band-pass filter includes a plurality of band-pass filters aligned in parallel, the plurality of band-pass filters including a first band-pass filter and a second band-pass filter. Frequencies of the signals outputted from the first band-pass filter and the second band-pass filter are different from each other.

Thus, a plurality of signals at different frequencies can be generated simultaneously. Therefore, the direct digital synthesizer can flexibly respond to a change in a specification of an equipment to be connected thereto, a change in the number of the equipments, and the like.

According to a second aspect of the present invention, a reference frequency generating device having the following configuration is provided. That is, this reference frequency generating device includes the direct digital synthesizer of described above, and a phase comparing unit. The phase comparing unit compares phases of either one of the signal generated by the numerically controlled oscillator and a signal based thereon, and a reference signal, and outputs the comparison result. Moreover, the numerically controlled oscillator outputs the sawtooth wave based on the comparison result. At least one of the signal outputted from the band-pass filter and a signal based thereon is a reference frequency signal.

Since a PLL circuit is formed as above, the NCO can output the sawtooth wave synchronized with the reference signal. Therefore, a highly accurate reference frequency signal can be outputted.

The reference frequency generating device described above is preferably configured as follows. That is, the reference frequency generating device includes a subsequent phase synchronization circuit configured to use either one of the sine wave outputted from the band-pass filter and a signal based on this sine wave as the reference signal. The subsequent phase synchronization circuit includes a voltage controlled oscillator configured to output a signal synchronized with either one of the sine wave outputted from the band-pass filter and the signal based on this sine wave. The signal outputted from the voltage controlled oscillator is the reference frequency signal.

Thus, the PLL circuit (subsequent phase synchronization circuit) with the analog signal obtained after jitter which appears in a digital signal is removed is formed. Therefore, a stable reference frequency signal can be outputted.

According to a third aspect of the present invention, the following sine wave outputting method is provided. That is, this sine wave outputting method includes causing a numerically controlled oscillator to generate a sawtooth wave, converting either one of the sawtooth wave outputted from the numerically controlled oscillator and a signal obtained based on the sawtooth wave, from a digital signal into an analog signal, and extracting a sine wave at a predetermined frequency from the signal converted into the analog signal in the converting, by applying a band-pass filter configured to allow a signal at a frequency within a fixed range to pass therethrough.

Thus, by using different band-pass filters with different frequency bands (passing bands) to pass therethrough, not only the sine wave at the same frequency as the sawtooth wave, but also sine waves at various frequencies can be outputted. Moreover, the sine wave can be outputted without providing a ROM for storing the table, which has been used in the conventional DDS. Therefore, the DDS can be reduced in size, as well as the manufacturing cost.

DETAILED DESCRIPTION OF EMBODIMENTS

Figure 1:
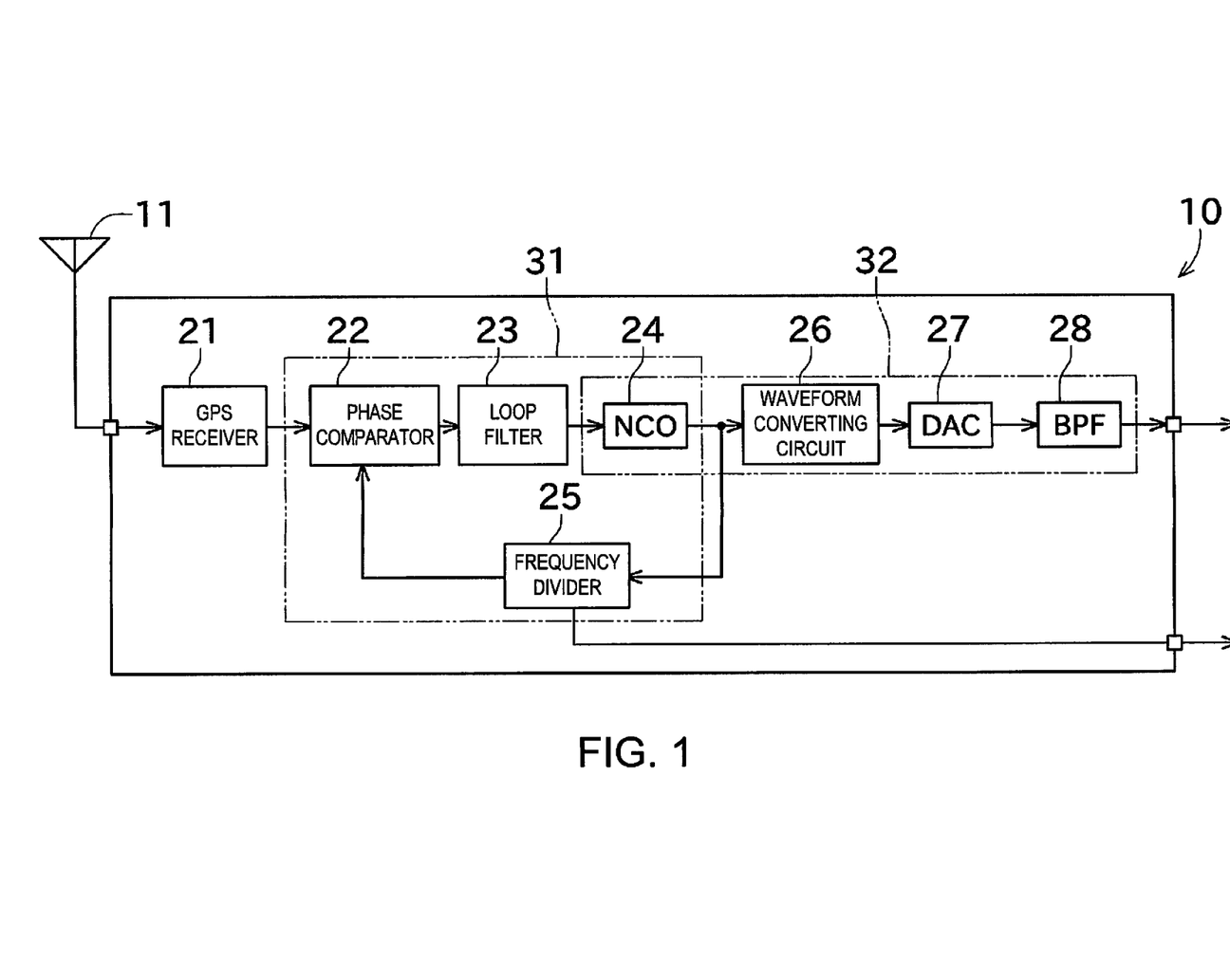
FIG. 1 is a block diagram illustrating a configuration of a reference frequency generating device according to one embodiment of the present invention.

Next, an embodiment of the present invention is described. FIG. 1 is a block diagram schematically illustrating a reference frequency generating device 10 according to the one embodiment of the present invention. The reference frequency generating device 10 is for providing a reference frequency signal to user-side equipment to which the reference frequency generating device is to be connected. Examples of targets to be supplied the reference frequency signal from the reference frequency generating device 10 include a base station of mobile phones, a transmitter station of terrestrial digital broadcasting, a WiMAX (Worldwide Interoperability for Microwave Access) communication facility, and the like.

The reference frequency generating device 10 of this embodiment includes a GPS receiver 21, a PLL (Phase Locked Loop) circuit 31, and a DDS (Direct Digital Synthesizer) 32.

The GPS receiver 21 is connected with a GPS antenna 11 installed outside the reference frequency generating device 10. The GPS receiver 21 performs positioning based on positioning signals received by this GPS antenna 11 to generate a reference signal (a pulse signal generated once every second). This reference signal is suitably corrected so as to accurately synchronize with one second of universal time coordinated (UTC).

Next, the PLL circuit 31 is described. As illustrated in FIG. 1, the PLL circuit 31 includes a phase comparator (phase comparing unit) 22, a loop filter 23, an NCO (numerically controlled oscillator) 24, and a frequency divider 25. This PLL circuit 31 compares phases of the reference signal outputted from the GPS receiver 21 and a signal obtained by dividing the frequency of a signal outputted from the NCO 24, and adjusts the frequency of the signal outputted from the NCO 24 based on the comparison result. Hereinafter, the respective components configuring the PLL circuit 31 are described in detail.

The phase comparator 22 receives the reference signal and the signal obtained by dividing the frequency of the signal outputted from the NCO 24. The phase comparator 22 compares the phases of these signals to obtain a phase difference therebetween, and outputs a signal (phase difference signal) based on the phase difference. This phase difference signal is outputted to the loop filter 23.

The loop filter 23 is configured as a low-pass filter for cutting off a high frequency element and removing noise of the phase difference signal inputted from the phase comparator 22. The phase difference signal after the cutoff of the high frequency element and the removal of the noise by the loop filter 23 is outputted to the NCO 24.

The NCO 24 is a digitally controlled oscillator for outputting a signal to serve as a base of the reference frequency signal. The NCO 24 includes a register and an adder which are not illustrated. The NCO 24 outputs a signal of which an output value gradually increases and returns back to 0 at a predetermined cycle (sawtooth wave, see FIG. 6(a) described later, for example) by the adder and the register. Note that, in the description hereinafter, the output value of the NCO 24 may be called particularly "a phase of the sawtooth wave," focusing on a periodic change thereof.

Moreover, the phase difference signal is inputted to the NCO 24 from the loop filter 23. Based on this phase difference signal, the NCO 24 generates the sawtooth wave so as to eliminate the phase difference between the reference signal and the signal obtained by dividing the frequency of the signal to be outputted from the NCO 24. The sawtooth wave is outputted to a later-described waveform converting circuit (waveform converting unit) 26 provided in the DDS 32, and the frequency divider 25.

The frequency divider 25 divides the frequency of the signal outputted from the NCO 24 to convert it from a high frequency into a low frequency, and outputs the obtained signal (phase comparison signal) to the phase comparator 22. For example, when the reference frequency signal is 10 MHz, the frequency divider 25 divides the frequency of this signal of 10 MHz at a frequency division ratio of 1/10,000,000 to generate the phase comparison signal of 1 Hz. Then this phase comparison signal is outputted as a timing signal from an output terminal to an external user-side system, as well as to the phase comparator 22.

With the configuration described above, a loop of the PLL circuit 31 is formed. For example, a case is considered where the timing for the adder of the NCO 24 to perform integration is changed due to an aging variation, a temperature change in the surroundings and a supply voltage, etc. In this case, the phase of the sawtooth wave outputted from the NCO varies and a stable reference frequency signal cannot be outputted. However, the PLL circuit 31 digital-controls the NCO 24 based on an accurate 1PPS signal inputted from the GPS receiver 21 so that the variation of the phase of the sawtooth wave is eliminated. Therefore, even in the case where the timing for the adder to perform the integration is changed as described above, the accuracy of the reference frequency to be outputted from the reference frequency generating device 10 can be kept high.

Next, the DDS 32 is described. As illustrated in FIG. 1, the DDS 32 includes the NCO 24, the waveform converting circuit 26, a DAC (Digital to Analog Converter) 27, and a BPF (Band-pass Filter) 28. Note that, the NCO 24 is equipment that serves as a component of both of the PLL circuit 31 and the DDS 32.

Figure 2A:
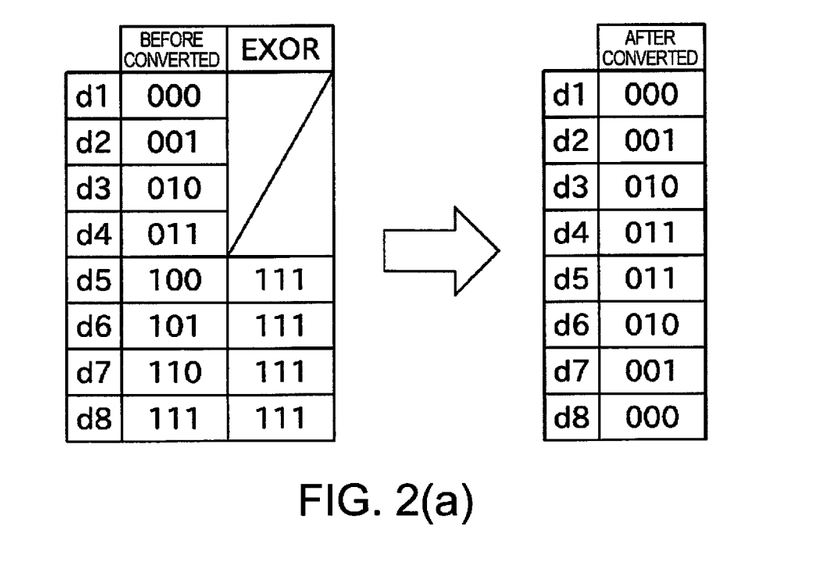
FIGS. 2(a) and 2(b) show views for describing how a sawtooth wave is converted into a triangle wave.
Figure 2B:
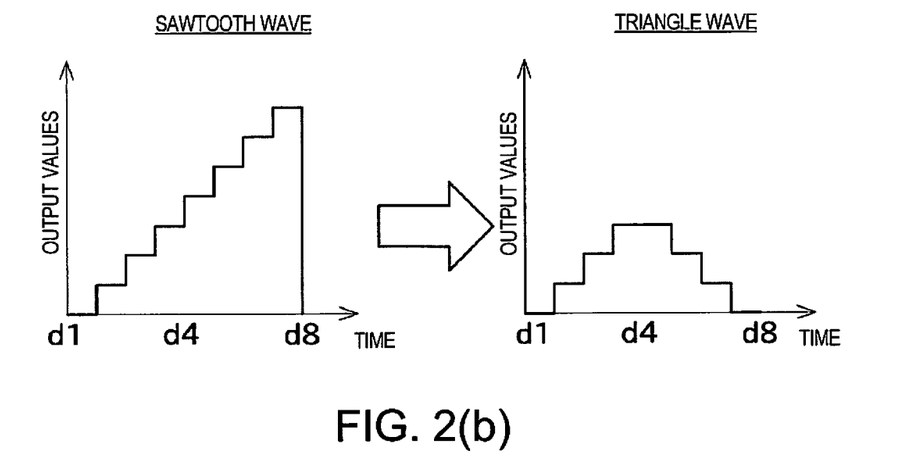

The waveform converting circuit 26 is a circuit for converting the sawtooth wave into a triangle wave by inverting a later-half cycle of the sawtooth wave generated by the NCO 24. Hereinafter, this waveform converting circuit 26 is described in detail with reference to FIG. 2. FIG. 2 shows views for describing how the sawtooth wave is converted into the triangle wave. Note that, to simplify the description, in the example of FIG. 2, one cycle of the sawtooth wave is expressed with eight steps of output values; however normally, the sawtooth wave is expressed with a larger number of steps of data.

In the column of "before converted" in the table illustrated in FIG. 2(a), the change of the phase of the sawtooth wave outputted from the NCO 24 is described with three-bit binary digits. As illustrated in this table, it can be understood that the sawtooth wave indicates a waveform where the output value increases by one at a time (see the left-side chart in FIG. 2(b)). The waveform converting circuit 26 is a logic circuit which takes an exclusive disjunction of the later-half portion (d5 to d8) of this sawtooth wave with "111." By taking the exclusive disjunction, as described in the column of "after converted" on the right side in FIG. 2(a), the bits of the output values of the later-half portion are inverted.

As described above, a triangle wave of which the output value gradually increases in the earlier-half portion (d1 to d4) and gradually reduces in the later-half portion (d5 to d8) can be obtained (see the right-side chart in FIG. 2(b)). Note that, the waveform converting circuit 26 is not essential in the present invention, and a configuration in which the sawtooth wave outputted from the NCO 24 is directly outputted to the DAC 27 may be adopted. The triangle wave outputted from the waveform converting circuit 26 is outputted to the DAC 27.

The DAC 27 converts the triangle wave inputted from the waveform converting circuit 26, from a digital signal into an analog signal. The triangle wave converted into the analog signal by the DAC 27 is outputted to the BPF 28.

The BPF 28 is a filter having a configuration that only allows signals in a predetermined frequency band (passing band) to pass therethrough but does not allow signals with other frequencies to pass therethrough. Moreover, a triangle wave is known to be a wave formed by superimposing a certain sine wave with odd overtones thereof. On the other hand, the sawtooth wave is known to be a wave formed by superimposing a certain sine wave with even and odd overtones thereof. Therefore, by applying the BPF 28 to either one of the triangle wave and the sawtooth wave inputted from the DAC 27, a sine wave at a frequency around the passing band can be extracted. The sine wave at the predetermined frequency extracted by the BPF 28 is supplied to external equipment as the reference frequency signal via an output terminal.

Figure 3A:
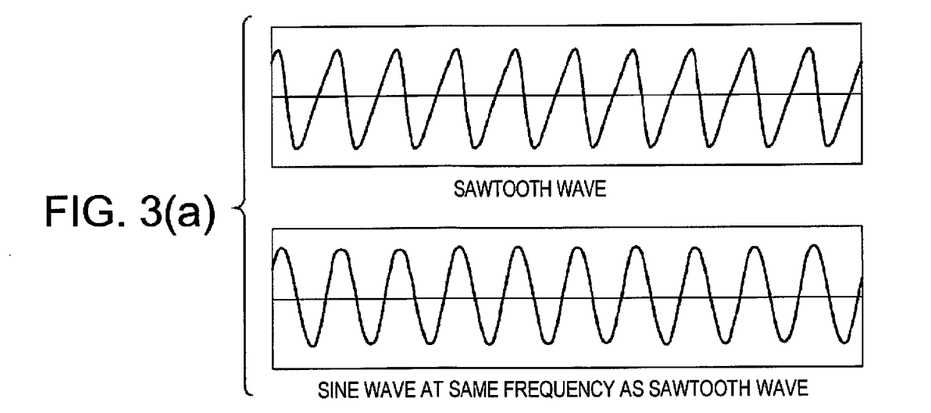
FIGS. 3(a), 3(b) and 3(c) show charts illustrating situations where a sine wave with an integral multiple of a frequency of the sawtooth wave is obtained.
Figure 3B:
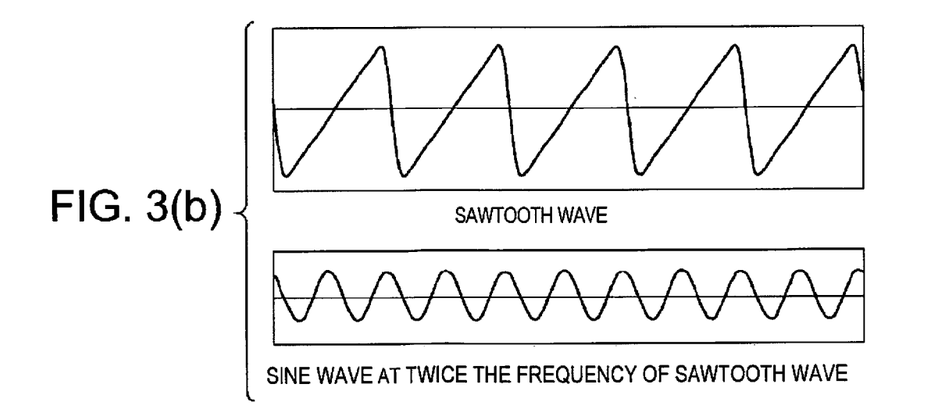
Figure 3C:
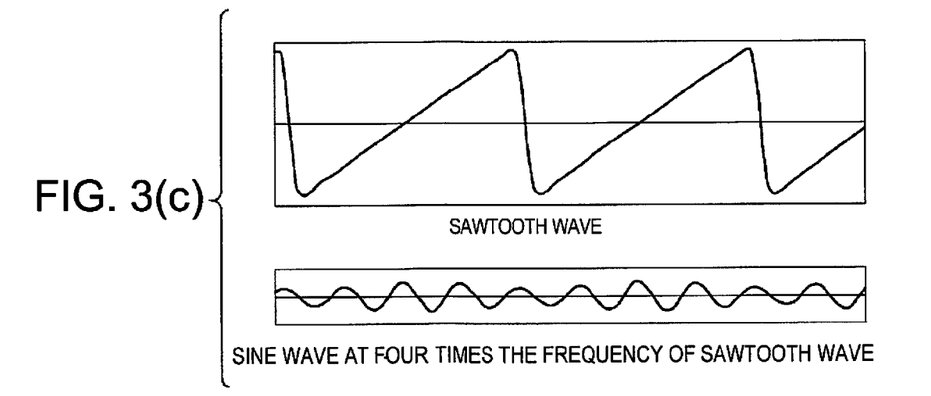

Note that, by changing the BPF 28, as illustrated in the charts of FIG. 3, a sine wave at the same frequency as the sawtooth wave can be extracted (FIG. 3(a)), a sine wave at twice the frequency of the sawtooth wave can be extracted (FIG. 3(b)), and a sine wave at four-times the frequency of the sawtooth wave can be extracted (FIG. 3(c)). Similarly for the triangle wave, by changing the BPF 28, a sine wave at the odd overtones can be extracted. As described above, by using the DDS of the present invention, the sine wave to which an integral multiple of the frequency of either one of the sawtooth wave and the triangle wave is set can be extracted.

As described above, the DDS 32 of this embodiment includes the NCO 24, the DAC 27, and the BPF 28. The NCO 24 outputs the sawtooth wave (sawtooth wave generating process). The DAC 27 converts, from the digital signal into the analog signal, either one of the sawtooth wave outputted from the NCO 24 and the triangle wave signal converted by the waveform converting circuit 26 based on the sawtooth wave (analog converting process). The BPF 28 is inputted with the signal converted into the analog signal by the DAC 27, and among the inputted signals, by allowing the signal at the frequency within a fixed range to pass therethrough, extracts the sine wave at the predetermined frequency (sine wave extracting process).

Thus, the sine wave can be outputted without providing a ROM for storing the table, which has been used in the conventional DDS, and while suppressing an operation amount. Therefore, the DDS can be reduced in size, and the manufacturing cost can be reduced. Moreover, by using different BPFs 28 at different frequency bands (passing bands) to pass therethrough, not only the sine wave at the same frequency as the sawtooth wave, but also sine waves at various frequencies can be outputted.

Figure 4:
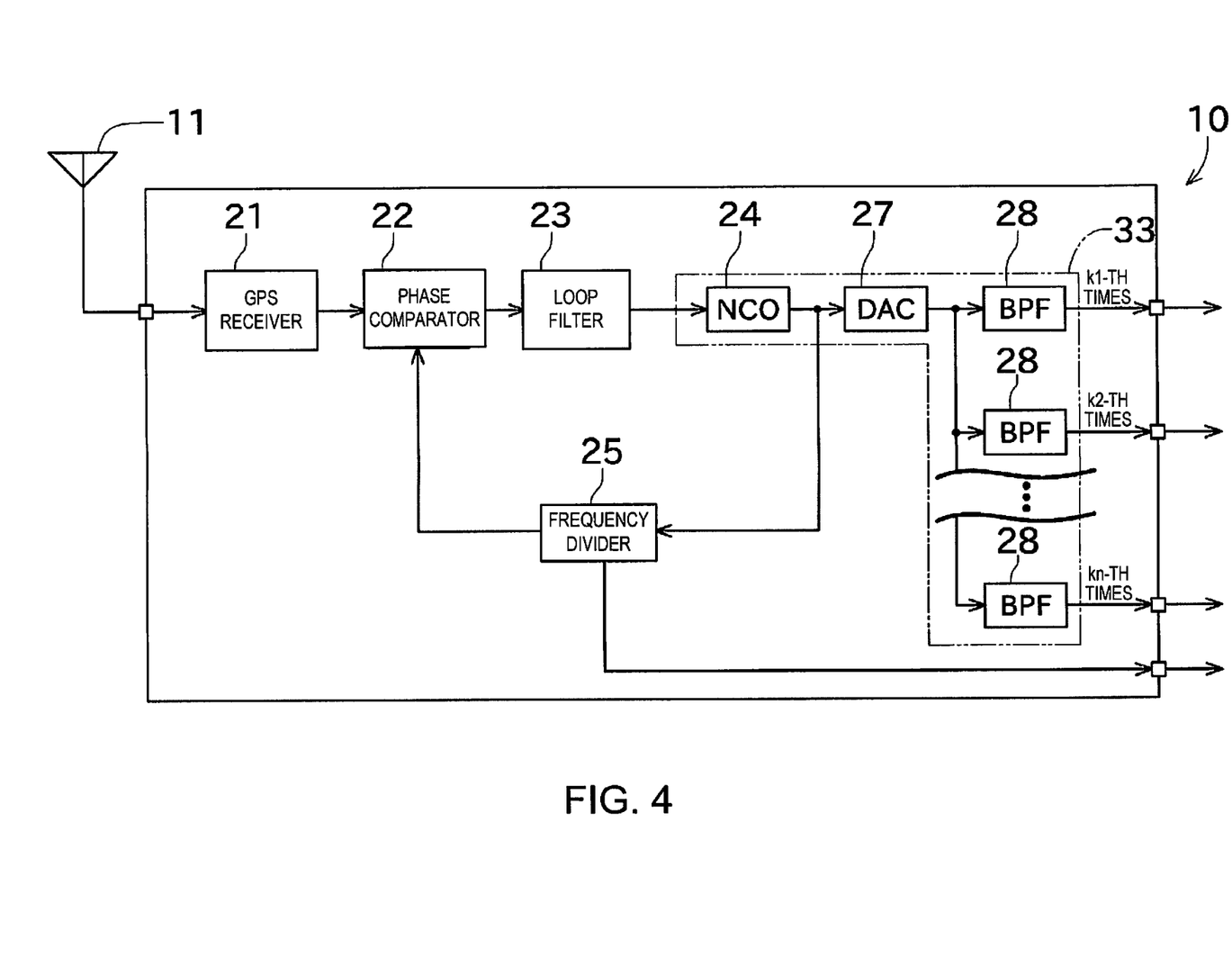
FIG. 4 is a block diagram illustrating a configuration of a reference frequency generating device according to a first modification.
Figure 8B:
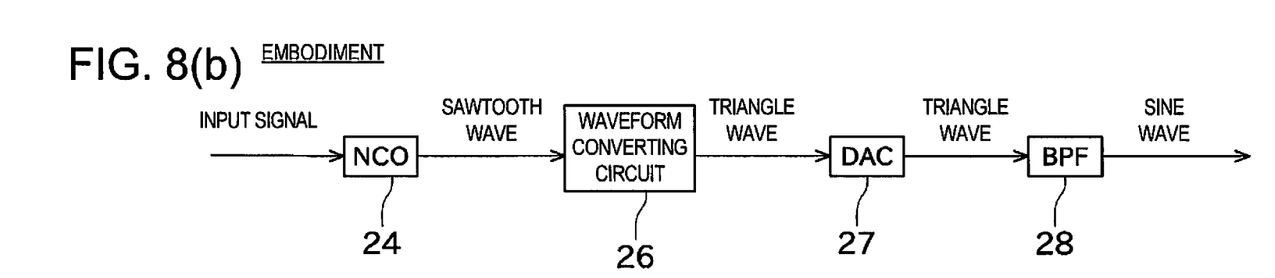
Figure 8C:
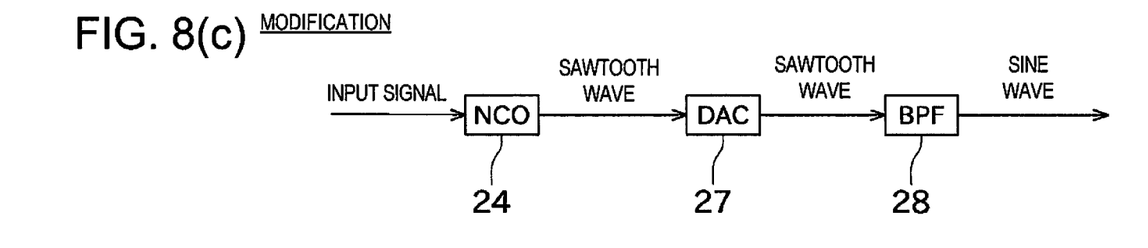

Next, a first modification is described with reference to FIG. 4. FIG. 4 is a block diagram illustrating a configuration of a reference frequency generating device 10 according to the first modification. Note that, in the descriptions of the first modification, a second modification described later and the like, the same reference numerals are denoted in the drawings for the same or similar members to those in the embodiment described above, and the descriptions thereof may be omitted. Moreover, in the following modifications, differently to the above embodiment, a configuration in which the waveform converting circuit 26 is not provided is adopted (FIG. 8(c));

however, the configuration in which the waveform converting circuit 26 is provided (FIG. 8(*b*)), the same configuration to the above embodiment may be adopted as well.

A DDS 33 of the reference frequency generating device 10 of this modification has a configuration in which a plurality of BPFs 28 are aligned in parallel. Further, each BPF 28 has a different frequency band of the signal to pass therethrough. Therefore, in this DDS 33, the frequency of the sine wave outputted from each BPF 28 can be different from each other.

With this configuration, a plurality of reference frequency signals at different frequencies can be generated simultaneously. Therefore, the reference frequency generating device 10 which can flexibly respond to a change in the specification of the equipment to be connected thereto, a change of the equipment itself, a change in the number of the equipments, and the like can be achieved.

Figure 5:
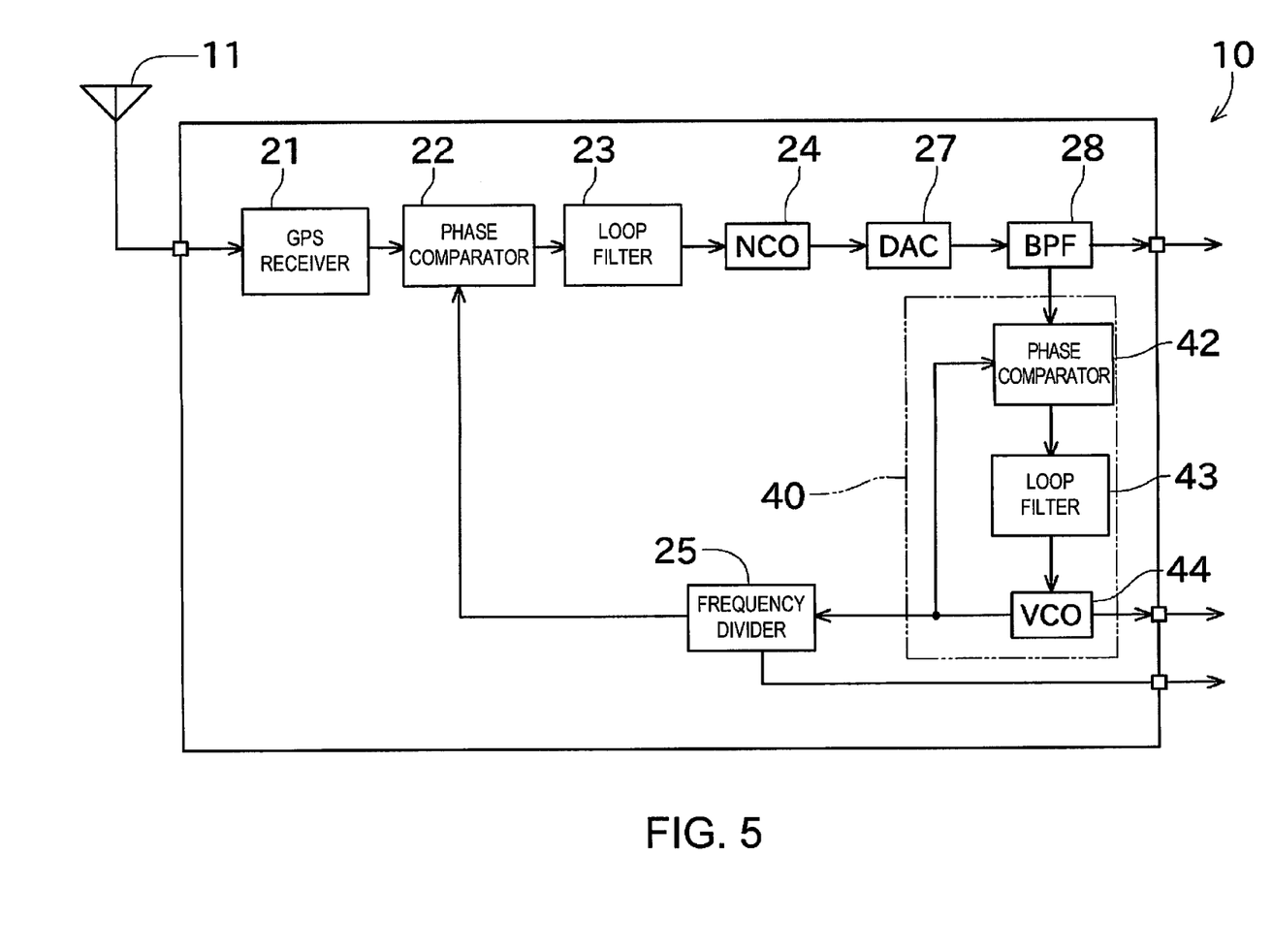
FIG. 5 is a block diagram illustrating a configuration of a reference frequency generating device according to a second modification.
Figure 6A:
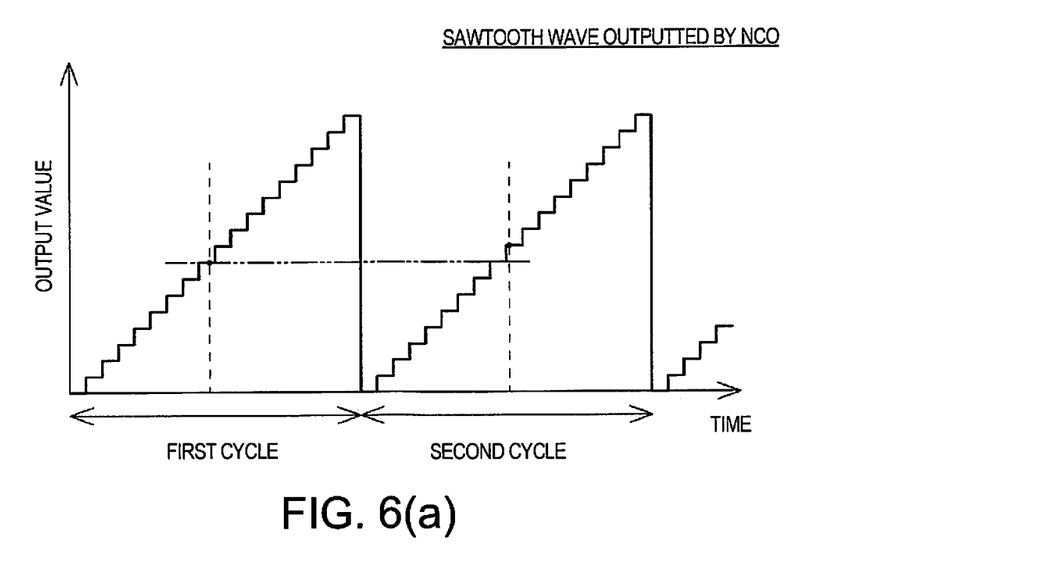
FIGS. 6(a) and 6(b) show charts illustrating a difference between a digital signal and an analog signal.
Figure 6B:
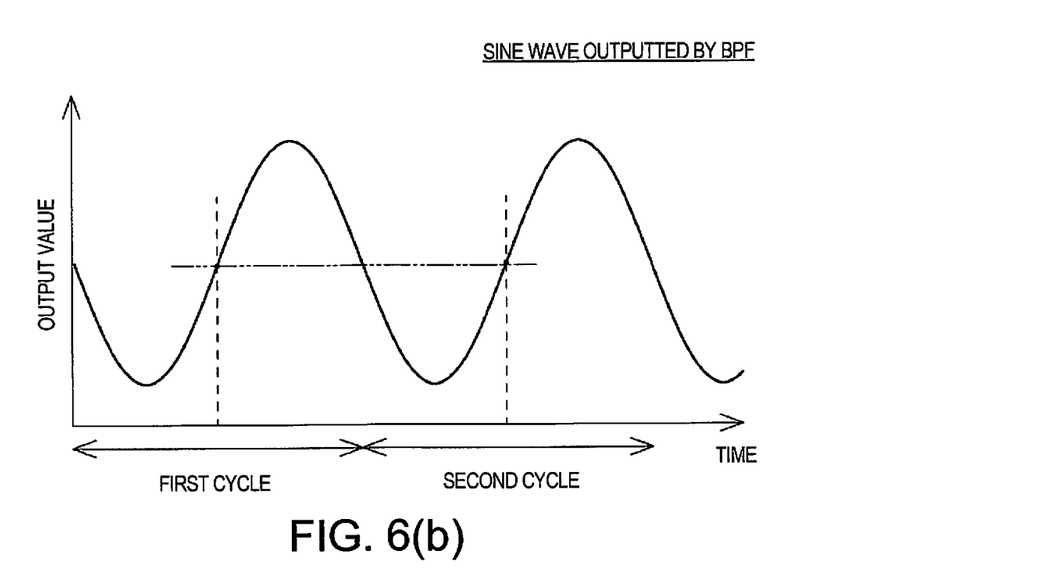

Next, the second modification is described with reference to FIGS. 5 and 6. FIG. 5 is a block diagram illustrating a configuration of a reference frequency generating device 10 according to the second modification. FIG. 6 shows charts illustrating a difference between the digital signal and the analog signal.

The reference frequency generating device 10 of the second modification, in addition to the configuration of the above embodiment, includes a subsequent PLL circuit 40 using the sine wave outputted from the BPF 28. This subsequent PLL circuit 40 includes a phase comparator 42, a loop filter 43, and a VCO (Voltage Controlled Oscillator) 44.

The phase comparator 42 and the loop filter 43 have substantially similar configurations to the phase comparator 22 and the loop filter 23 described above. Moreover, the VCO 44 is an oscillator which can change the frequency to be outputted, depending on a voltage level to be applied externally.

In the second modification, as illustrated in FIG. 5, the sine wave outputted from the BPF 28 is outputted outside as a first reference frequency signal, as well as outputted to the phase comparator 42. The phase comparator 42 compares the phases of the signal outputted from this BPF and the signal outputted from the VCO 44 and outputs the comparison result to the loop filter 43.

The loop filter 43 converts the signals indicating the comparison result into a controlled voltage signal by averaging the voltage levels of the signals in terms of time. This controlled voltage signal is outputted to the VCO 44.

The VCO 44 generates a signal at a frequency based on this controlled voltage signal. This signal is outputted outside as a second reference frequency signal, as well as outputted to the phase comparator 42 and the frequency divider 25.

The phase comparator 42 uses the signal outputted from the VCO 44 to perform the phase comparison described above. The frequency divider 25, similarly to the above embodiment, generates the phase comparison signal of 1 Hz by dividing the frequency of the signal outputted from the VCO 44.

As above, in the second modification, the phase comparison using the digital signal outputted from the NCO 24 is not performed. In the second modification, the phase comparison using the analog signal outputted from the BPF 28 is performed by the phase comparator 42, and the phase comparison using the signal obtained by dividing the frequency of the analog signal outputted from the VCO 44 is performed by the phase comparator 22. By performing the phase comparisons using the analog signals, influence of jitter which is typical with a digital signal is eliminated, and therefore, highly accurate phase comparisons can be performed.

Hereinafter, the jitter which appears with a digital signal is described. Since the sawtooth wave generated by the NCO 24 is a digital signal, the waveform thereof is not exactly smooth. As illustrated in FIG. 6(*a*), the sawtooth wave has a stepwise waveform. Therefore, for example, the output value at the center of a first cycle of the sawtooth wave, and the output value at the center of a second cycle thereof may not indicate the same value and be different by one step. Such a variation of the signal is jitter. By the influence of this jitter, the accuracy of the synchronization control performed by the PLL circuit 31 slightly degrades.

On the other hand, with the signal outputted from the BPF 28, since the stepwise sine wave is complemented by the DAC 27 to become an analog signal, as illustrated in FIG. 6(*b*), it has a smoothly curved waveform. Therefore, jitter which is typical with the digital signal described above does not occur. Therefore, by forming the subsequent PLL circuit 40 using the sine wave outputted from this BPF 28, it can be prevented that the accuracy of the synchronization control degrades. This is similar with the signal outputted from the VCO 44, which is an analog signal samely.

Figure 7:
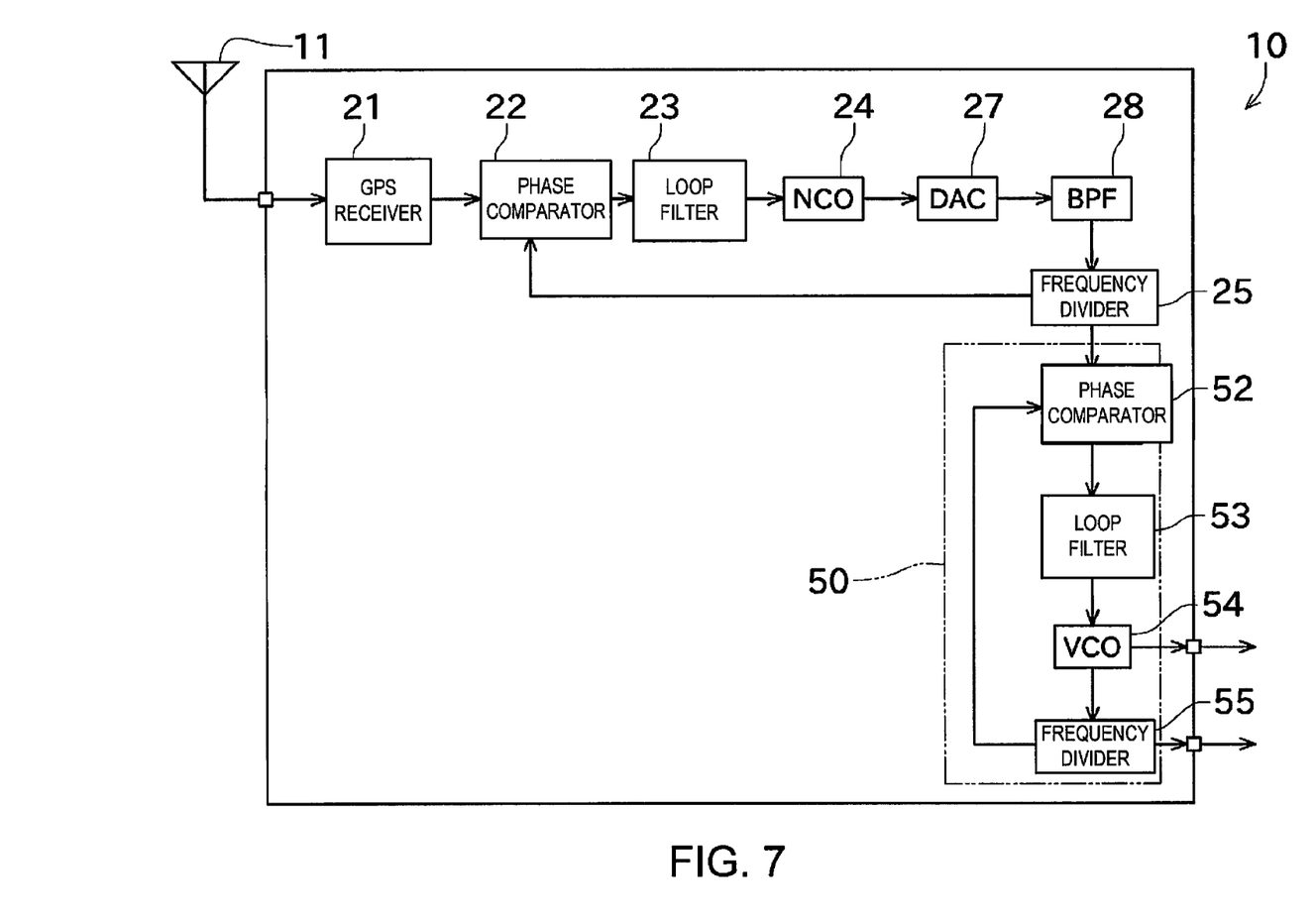
FIG. 7 is a block diagram illustrating a configuration of a reference frequency generating device according to a third modification.

Next, a third modification is described with reference to FIG. 7. FIG. 7 is a block diagram illustrating a configuration of a reference frequency generating device 10 according to the third modification.

In the third modification, a configuration in which a subsequent PLL circuit 50 is formed similarly to the second modification is adopted, and in the configuration, the sine wave outputted from the BPF 28 is outputted to the subsequent PLL circuit 50 after the frequency thereof is divided. Note that, the signal outputted from the BPF 28 may be outputted as the reference frequency signal as in the second modification, or may be not outputted as in the third modification.

The subsequent PLL circuit 50 includes a phase comparator 52, a loop filter 53, a VCO 54, and a frequency divider 55. Note that, since the respective components configuring the subsequent PLL circuit 50 have substantially the same configurations as the components with the same names described above, the descriptions thereof are omitted.

The phase comparator 52 compares the phases of the signal obtained by dividing the frequency of the signal outputted from the BPF 28 and the signal obtained by dividing the frequency of the signal outputted from the VCO 54, and outputs the comparison result to the loop filter 53.

The loop filter 53 converts the signal indicating the comparison result into a controlled voltage signal and outputs it to the VCO 54.

The VCO 54 generates a signal at a frequency based on this controlled voltage signal. This signal is outputted outside as a reference frequency signal, as well as outputted to the frequency divider 55.

The frequency divider 55 divides the frequency of the signal outputted from the VCO 54 and outputs the frequency-divided signal as a timing signal from an output terminal to external equipment, as well as to the phase comparator 52. Note that, also in the third modification, since the subsequent PLL circuit 50 performs the phase comparison using the analog signal, the degradation in accuracy due to the jitter which is typical with the digital signal can be prevented.

Although the preferred embodiment and the modifications of the present invention are described above, the above configurations may be modified as follows.

The above embodiment and modifications have the configurations in which the reference signal is generated based on the signals from the GPS satellites; however, as long as it is a configuration using GNSS (Global Navigation Satellite System), the configuration may suitably be changed. For example, the configuration may be changed to what in which the reference signal is generated based on the signals from GLONASS satellites or GALILEO satellites. Further, a configuration in which the reference signal from an external device is acquired may be adopted.

The configuration may be changed to what in which the GPS receiver is disposed outside the reference frequency generating device 10 and the 1PPS signal (reference signal) is inputted externally. Moreover, the configuration may be changed to what in which the GPS receiver supplies a signal other than 1 Hz, such as PP2S instead of 1PPS, as the reference signal to the reference frequency generating device 10.

The waveform converting circuit is not limited to the configuration described above using the exclusive disjunction, and may be achieved by a circuit with an arbitrary configuration. Moreover, a configuration may be adopted, in which a plurality of waveform converting circuits are provided, and a triangle wave for two cycles is obtained from a triangle wave for one cycle by inverting a portion of the triangle wave described above (central two portions when divided into four portions).

The respective components provided to the reference frequency generating device 10, instead of being configured as hardware, may be comprised of software.

What is claimed is:

1. A direct digital synthesizer, comprising:
    a numerically controlled oscillator configured to output a sawtooth wave;
    a waveform converting unit configured to convert the sawtooth wave outputted from the numerically controlled oscillator into a triangle wave;
    a DAC configured to convert either one of the sawtooth wave outputted from the numerically controlled oscillator and the triangle wave obtained based on the sawtooth wave, from a digital signal into an analog signal; and
    a band-pass filter configured to receive the signal converted into the analog signal by the DAC and extract a sine wave at a predetermined frequency from the received signal, by allowing a signal at a frequency within a fixed range to pass therethrough.

2. The direct digital synthesizer of claim 1, wherein
    the waveform converting unit includes a circuit configured to perform operation of an exclusive disjunction on a half cycle of the sawtooth wave to invert the sawtooth wave of the half cycle.

3. The direct digital synthesizer of claim 2, wherein
    the band-pass filter includes a plurality of band-pass filters aligned in parallel, the plurality of band-pass filters including a first band-pass filter and a second band-pass filter, and
    frequencies of the signals outputted from the first band-pass filter and the second band-pass filter are different from each other.

4. A reference frequency generating device, comprising:
    the direct digital synthesizer of claim 3; and
    a phase comparing unit configured to compare phases of either one of the sawtooth wave generated by the numerically controlled oscillator and the triangle wave based thereon, and a reference signal, and output the comparison result,
    the numerically controlled oscillator being configured to output the sawtooth wave based on the comparison result, and
    at least one of the signal outputted from the band-pass filter and a signal based thereon being a reference frequency signal.

5. The reference frequency generating device of claim 4, further comprising
    a subsequent phase synchronization circuit configured to use either one of the sine wave outputted from the band-pass filter and a signal based on this sine wave as the reference signal,
    the subsequent phase synchronization circuit including a voltage controlled oscillator configured to output a signal synchronized with either one of the sine wave outputted from the band-pass filter and the signal based on this sine wave, and
    the signal outputted from the voltage controlled oscillator being the reference frequency signal.

6. The direct digital synthesizer of claim 1, wherein
    the band-pass filter includes a plurality of band-pass filters aligned in parallel, the plurality of band-pass filters including a first band-pass filter and a second band-pass filter, and
    frequencies of the signals outputted from the first band-pass filter and the second band-pass filter are different from each other.

7. A reference frequency generating device, comprising:
    the direct digital synthesizer of claim 1; and
    a phase comparing unit configured to compare phases of either one of the sawtooth wave generated by the numerically controlled oscillator and the triangle wave based thereon, and a reference signal, and output the comparison result,
    the numerically controlled oscillator being configured to output the sawtooth wave based on the comparison result, and
    at least one of the signal outputted from the band-pass filter and a signal based thereon being a reference frequency signal.

8. The reference frequency generating device of claim 7, further comprising
    a subsequent phase synchronization circuit configured to use either one of the sine wave outputted from the band-pass filter and a signal based on this sine wave as the reference signal,
    the subsequent phase synchronization circuit including a voltage controlled oscillator configured to output a signal synchronized with either one of the sine wave outputted from the band-pass filter and the signal based on this sine wave, and
    the signal outputted from the voltage controlled oscillator being the reference frequency signal.

9. A reference frequency generating method, comprising:
    the method of outputting a sine wave according to claim 1; and
    comparing phases of either one of the sawtooth wave and the triangle wave based thereon, and a reference signal, and outputting the comparison result,
    the causing causes the numerically controlled oscillator to output the sawtooth wave based on the comparison result, and
    at least one of the signal outputted from the band-pass filter and a signal based thereon being a reference frequency signal.

10. The reference frequency generating method according to claim 9, further comprising
    operating a subsequent phase synchronization circuit configured to use either one of the sine wave outputted from the band-pass filter and a signal based on this sine wave as the reference signal,
    the subsequent phase synchronization circuit including a voltage controlled oscillator configured to output a signal synchronized with either one of the sine wave outputted from the band-pass filter and the signal based on this sine wave, and the signal outputted from the voltage controlled oscillator being the reference frequency signal.

11. A method of outputting a sine wave, comprising:

causing a numerically controlled oscillator to generate a sawtooth wave;

converting the sawtooth wave outputted from the numerically controlled oscillator into a triangle wave;

converting either one of the sawtooth wave outputted from the numerically controlled oscillator and the triangle wave obtained based on the sawtooth wave, from a digital signal into an analog signal; and extracting a sine wave at a predetermined frequency from the signal converted into the analog signal in the converting, by applying a band-pass filter configured to allow a signal at a frequency within a fixed range to pass therethrough.

12. The method of outputting a sine wave according to claim 11, wherein the converting of the sawtooth wave includes performing an exclusive disjunction on a half cycle of the sawtooth wave to invert the sawtooth wave of the half cycle.

13. The method of outputting a sine wave according to claim 12, wherein the applying the band-pass filter includes applying a plurality of band-pass filters aligned in parallel, the plurality of band-pass filters including a first band-pass filter and a second band-pass filter, such that frequencies of the signals outputted from the first band-pass filter and the second band-pass filter are different from each other.

14. The method of outputting a sine wave according to claim 11, wherein the applying the band-pass filter includes applying a plurality of band-pass filters aligned in parallel, the plurality of band-pass filters including a first band-pass filter and a second band-pass filter, such that frequencies of the signals outputted from the first band-pass filter and the second band-pass filter are different from each other.

15. A reference frequency generating method, comprising:

the method of outputting a sine wave according to claim 13; and comparing phases of either one of the sawtooth wave and the triangle wave based thereon, and a reference signal, and outputting the comparison result, the causing causes the numerically controlled oscillator to output the sawtooth wave based on the comparison result, and at least one of the signal outputted from the band-pass filter and a signal based thereon being a reference frequency signal.

16. The reference frequency generating method according to claim 15, further comprising operating a subsequent phase synchronization circuit configured to use either one of the sine wave outputted from the band-pass filter and a signal based on this sine wave as the reference signal, the subsequent phase synchronization circuit including a voltage controlled oscillator configured to output a signal synchronized with either one of the sine wave outputted from the band-pass filter and the signal based on this sine wave, and the signal outputted from the voltage controlled oscillator being the reference frequency signal.

* * * * *